(12) United States Patent
Nishikawa et al.

(10) Patent No.: US 7,619,500 B1
(45) Date of Patent: Nov. 17, 2009

(54) COMMON MODE FILTER

(75) Inventors: Tomonaga Nishikawa, Tokyo (JP); Tomokazu Ito, Tokyo (JP); Takeshi Okumura, Tokyo (JP); Makoto Yoshida, Tokyo (JP); Hiroshi Kamiyama, Tokyo (JP); Sho Nakagomi, Tokyo (JP); Tatsuya Karakame, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/463,756

(22) Filed: May 11, 2009

(30) Foreign Application Priority Data

May 16, 2008 (JP) ............................ P2008-129983

(51) Int. Cl.
*H01F 5/00* (2006.01)

(52) U.S. Cl. ...................................... 336/200

(58) Field of Classification Search .................... 336/65, 336/83, 192, 200, 232; 333/181–185
See application file for complete search history.

(56) References Cited

U.S. PATENT DOCUMENTS

| | | | |
|---|---|---|---|
| 6,710,694 B2 * | 3/2004 | Matsuta et al. ............... | 336/200 |
| 6,998,939 B2 * | 2/2006 | Nakayama et al. ........... | 333/181 |
| 7,064,629 B2 | 6/2006 | Shoji | |
| 7,091,816 B1 * | 8/2006 | Ito et al. ...................... | 336/200 |
| 7,253,713 B2 * | 8/2007 | Tomonari et al. ........... | 336/200 |
| 7,408,435 B2 | 8/2008 | Nishikawa et al. | |
| 7,446,632 B2 * | 11/2008 | Tomonari et al. ........... | 333/185 |

FOREIGN PATENT DOCUMENTS

| | | |
|---|---|---|
| JP | B2-3601619 | 12/2004 |
| JP | A-2005-159223 | 6/2005 |
| JP | A-2007-214448 | 8/2007 |
| JP | B1-4028884 | 12/2007 |

* cited by examiner

*Primary Examiner*—Tuyen Nguyen
(74) *Attorney, Agent, or Firm*—Oliff & Berridge, PLC

(57) ABSTRACT

A common mode filter is provided as one in a three-layered structure with improved high-frequency characteristics. The common mode filter 1 has the three-layered structure including a first coil layer 14, a second coil layer 18, and a lead layer 16. A first planar coil 21 and a second planar coil 41 of a substantially circular spiral shape are formed in the first and second coil layers 14, 18, respectively. A first lead wire 31 and a second lead wire 32 formed in a lead layer 16 have a first straight portion 31c and a second straight portion 32c, respectively. The first straight portion 31c is located on a straight line L1 perpendicular to a plurality of first tangent lines to spirals 22, 42 at a plurality of respective intersection points with the spirals 22, 42. The second straight portion 32c is located on a straight line L2 perpendicular to a plurality of second tangent lines to the spirals 22, 42 at a plurality of respective intersection points with the spirals 22, 42.

8 Claims, 7 Drawing Sheets

COMMON MODE FILTER

BACKGROUND OF THE INVENTION

1. Field of the Invention

The present invention relates to a laminated common mode filter including first and second coil layers with respective coils therein, and a lead layer with lead wires therein.

2. Related Background Art

Patent Document 1 below discloses a laminated common mode filter composed of a laminate and four terminal electrodes formed on the outer surface of the laminate. The laminate is formed in a four-layered structure with four layers, a first coil layer with a coil of a rectangular spiral shape, a first lead layer with a lead wire to lead one end of the foregoing coil to the terminal electrode, a second coil layer with a coil of a rectangular spiral shape, and a second lead layer with a lead wire to lead one end of the coil to the terminal electrode.

Patent Documents 2 and 3 below disclose the common mode filters of a three-layered structure in which the lead wire formed in the first lead layer and the lead wire formed in the second lead layer in the common mode filter disclosed in Patent Document 1 are formed in an identical lead layer. Patent Document 4 discloses the common mode filter in which the coils are formed in a circular spiral shape, when compared with the common mode filter disclosed in Patent Document 1.

Patent Document 1: Japanese Patent Application Laid-open No. 2005-159223

Patent Document 2: Japanese Patent No. 3601619

Patent Document 3: Japanese Patent No. 4028884

Patent Document 4: Japanese Patent Application Laid-open No. 2007-214448

SUMMARY OF THE INVENTION

The common mode filters of this kind are required to be more compact and to be improved in high-frequency characteristics. However, if the insulator layers between the coil layers and the lead layer(s) are made thinner in order to make the filter more compact, an electrical capacitance produced between the coils and the lead wires will increase. This will lead to a problem of degradation of high-frequency characteristics. If the three-layered structure is adopted instead of the four-layered structure in order to reduce the size and cost, the distance between the coils and the lead wires will decrease so as to increase the electrical capacitance, also resulting in degradation of high-frequency characteristics.

The present invention has been accomplished in order to solve the above problem and an object of the invention is to provide a common mode filter with improved high-frequency characteristics in the three-layered structure.

A common mode filter according to the present invention is a common mode filter comprising a laminate, and first, second, third, and fourth terminal electrodes formed on an outer surface of the laminate, wherein the laminate has a layered structure comprising three layers including a first coil layer, a second coil layer, and a lead layer, and insulator layers located between the three layers, wherein in the first coil layer there is a first planar coil which is formed in a substantially circular spiral shape and one end of which located outside of the spiral is electrically connected to the first terminal electrode, wherein in the second coil layer there is a second planar coil which is formed in a substantially circular spiral shape and one end of which located outside of the spiral is electrically connected to the second terminal electrode, wherein in the lead layer there are: a first lead wire one end of which is electrically connected to other end located inside of the spiral of the first planar coil and other end of which is electrically connected to the third terminal electrode; and a second lead wire one end of which is electrically connected to other end located inside of the spiral of the second planar coil and other end of which is electrically connected to the fourth terminal electrode, wherein the first lead wire has a first straight portion drawn from the inside to the outside of the spiral of the first planar coil, when viewed from a laminated direction of the laminate, wherein the second lead wire has a second straight portion drawn from the inside to the outside of the spiral of the second planar coil, when viewed from the laminated direction of the laminate, wherein the spiral of at least one of the first planar coil and the second planar coil is formed so that a plurality of first tangent lines thereto at a plurality of respective intersection points cross with the first straight portion are parallel to each other, when viewed from the laminated direction, and wherein the first straight portion is located on a straight line perpendicular to the plurality of first tangent lines, when viewed from the laminated direction.

The common mode filter of the present invention has the three-layered structure including the first coil layer, the second coil layer, and the lead layer. For this reason, it can achieve reduction in cost, size, and profile when compared with the four-layered structure. The first planar coil and the second planar coil are formed in the substantially circular spiral shape. For this reason, the coil length becomes shorter to improve the high-frequency characteristics, than in the configuration wherein the planar coils are formed in the rectangular spiral shape.

Furthermore, the spiral of at least one of the first planar coil and the second planar coil is formed so that the plurality of first tangent lines thereto at the plurality of respective intersection points cross with the first straight portion of the first lead wire are parallel to each other, when viewed from the laminated direction, and the first straight portion is located on the straight line perpendicular to the plurality of first tangent lines, when viewed from the laminated direction. This configuration can minimize the sum of overlap areas in the laminated direction between the first straight portion and at least one spiral. Therefore, the electrical capacitance produced between at least one spiral and the first straight portion is reduced, so as to improve the high-frequency characteristics.

The common mode filter of the present invention is also preferably configured as follows: the spiral of at least one of the first planar coil and the second planar coil is formed so that a plurality of second tangent lines thereto at a plurality of respective intersection points cross with the second straight portion are parallel to each other, when viewed from the laminated direction, and the second straight portion is located on a straight line perpendicular to the plurality of second tangent lines, when viewed from the laminated direction.

In this case, the sum of overlap areas in the laminated direction between the second straight portion and at least one spiral can be minimized. Therefore, the electrical capacitance produced between at least one spiral and the second straight portion is reduced, so as to improve the high-frequency characteristics.

The common mode filter of the present invention is also preferably configured as follows: the second coil layer and the lead layer are located next to each other through the insulator layer, and the spiral of the second planar coil is formed so that the plurality of first tangent lines thereto at the plurality of respective intersection points cross with the first straight portion are parallel to each other, when viewed from the laminated direction, and so that the plurality of second tangent lines thereto at the plurality of respective intersection points cross with the second straight portion are parallel to each other, when viewed from the laminated direction.

In this case, these first and second straight portions can minimize the sum of overlap areas in the laminated direction with the spiral of the adjacent planar coil among the spirals of the first and second planar coils. For this reason, the electrical capacitance produced with the planar coil closer thereto can be reduced, whereby the electrical capacitance caused by the first and second straight portions can be more effectively made smaller. Therefore, the high-frequency characteristics are improved.

The common mode filter of the present invention is also preferably configured as follows: the first coil layer and the lead layer are located next to each other through the insulator layer, and the spiral of the first planar coil is formed so that the plurality of first tangent lines thereto at the plurality of respective intersection points cross with the first straight portion are parallel to each other, when viewed from the laminated direction, and so that the plurality of second tangent lines thereto at the plurality of respective intersection points cross with the second straight portion are parallel to each other, when viewed from the laminated direction.

In this case, the lead layer is located next to both of the first coil layer and the second coil layer. Then the first and second straight portions can minimize the sum of overlap areas in the laminated direction with the respective spirals of the first and second planar coils. For this reason, the electrical capacitance caused by the first and second straight portions can be further effectively made smaller. Therefore, the high-frequency characteristics are improved.

The common mode filter of the present invention is also preferably configured as follows: an angle between the first straight portion and the second straight portion is between 15° and 45° both inclusive.

In this case, it is feasible to minimize the sum of overlap areas between the first straight portion and the spirals of the first and second planar coils and the sum of overlap areas between the second straight portion and the spirals of the first and second planar coils and to efficiently arrange a magnetic body in the lead layer.

The common mode filter of the present invention is also preferably configured as follows: the spiral of the first planar coil and the spiral of the second planar coil are superimposed on each other in the laminated direction.

In this case, it is easy to arrange the first straight portion and the second straight portion so as to be located on the straight line perpendicular to the plurality of first tangent lines to the spiral of the first planar coil and so as to be located on the straight line perpendicular to the plurality of second tangent lines to the spiral of the second planar coil.

The common mode filter of the present invention is also preferably configured as follows: in curves forming the spirals of the first planar coil and the second planar coil, regions including regions intersecting with the first straight portion and regions intersecting with the second straight portion are formed on concentric circles.

In this case, it is easier to arrange the first straight portion and the second straight portion so as to be located on the straight line perpendicular to the plurality of first tangent lines to the spiral of the first planar coil and so as to be located on the straight line perpendicular to the plurality of second tangent lines to the spiral of the second planar coil.

The common mode filter of the present invention is also preferably configured as follows: the laminate has a pair of magnetic substrates, and the layered structure interposed between the pair of magnetic substrates. In this case, the pair of magnetic substrates permits the common mode filter to fulfill its function better.

The common mode filter of the present invention successfully achieves the improvement in the high-frequency characteristics in the three-layered structure.

DESCRIPTION OF THE PREFERRED
EMBODIMENTS

The best mode for carrying out the present invention will be described below in detail with reference to the accompanying drawings. In the description of the drawings the same elements will be denoted by the same reference symbols, without redundant description.

Figure 1:
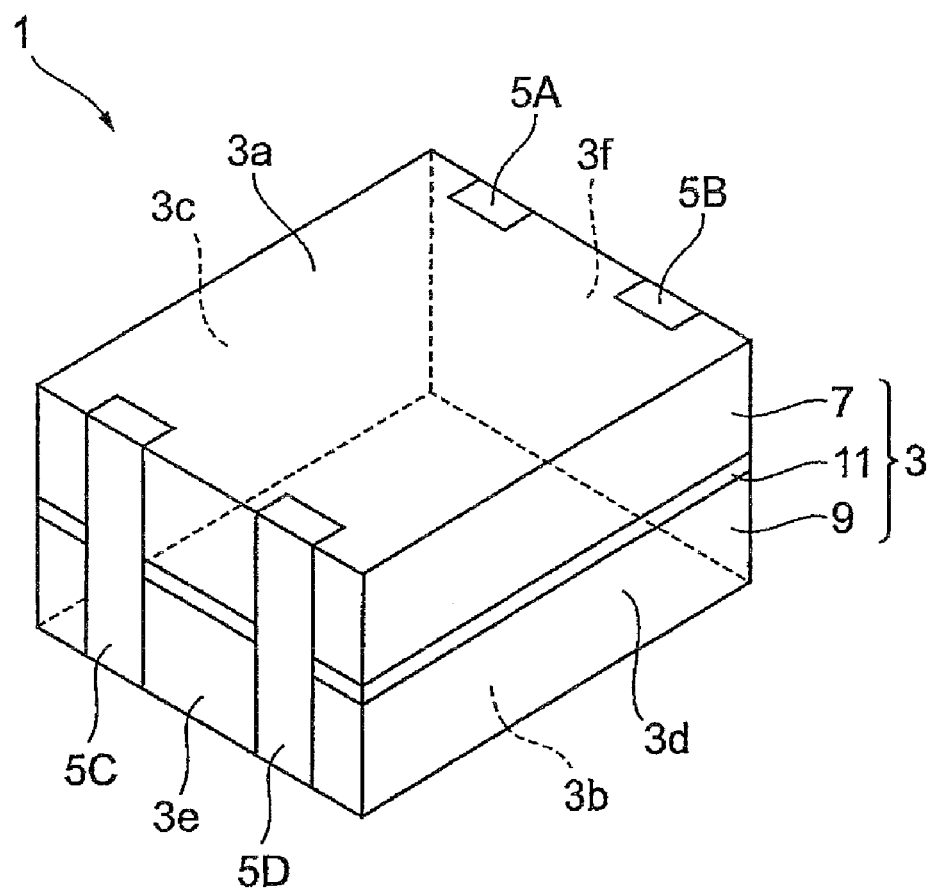
FIG. 1 is a perspective view of a common mode filter according to an embodiment of the present invention.

FIG. 1 is a perspective view of a common mode filter according to an embodiment of the present invention. The common mode filter 1 according to the present embodiment is used, for example, for rejecting noise in a circuit of a display of a cell-phone. For this purpose, the common mode filter 1 is constructed in a compact form and its size of a rectangular parallelepiped shape is approximately 1.2 mm×1.0 mm×0.6 mm.

This common mode filter 1 has a laminate 3 of a nearly rectangular parallelepiped shape, and first to fourth terminal electrodes 5A-5D formed on the outer surface of the laminate 3. The laminate 3 has an upper surface 3a and a lower surface 3b opposed to each other, a side surface 3c and a side surface 3d opposed to each other, and an end surface 3e and an end surface 3f opposed to each other. The first terminal electrode 5A and the second terminal electrode 5B are formed in a strip shape from the upper surface 3a to the lower surface 3b on the end surface 3f of the laminate 3 and are arranged as separated from each other. The third terminal electrode 5C and the fourth terminal electrode 5D are formed in a strip shape from the upper surface 3a to the lower surface 3b on the end surface 3e of the laminate 3 and are arranged as separated from each other.

The laminate 3 is composed of an upper magnetic substrate 7 whose principal surfaces are rectangular, a lower magnetic substrate 9 whose principal surfaces are of the same shape as those of the upper magnetic substrate 7, and a layered structure 11 interposed between the upper magnetic substrate 7 and the lower magnetic substrate 9. The upper magnetic substrate 7 and the lower magnetic substrate 9 are made of a magnetic material, e.g., sintered ferrite or, a resin containing powder ferrite (composite ferrite). The layered structure 11 has an upper surface thereof bonded through an adhesive layer (not shown) to the upper magnetic substrate 7. This adhesive layer can be made using epoxy resin, polyimide resin, polyamide resin, or the like.

Figure 2:
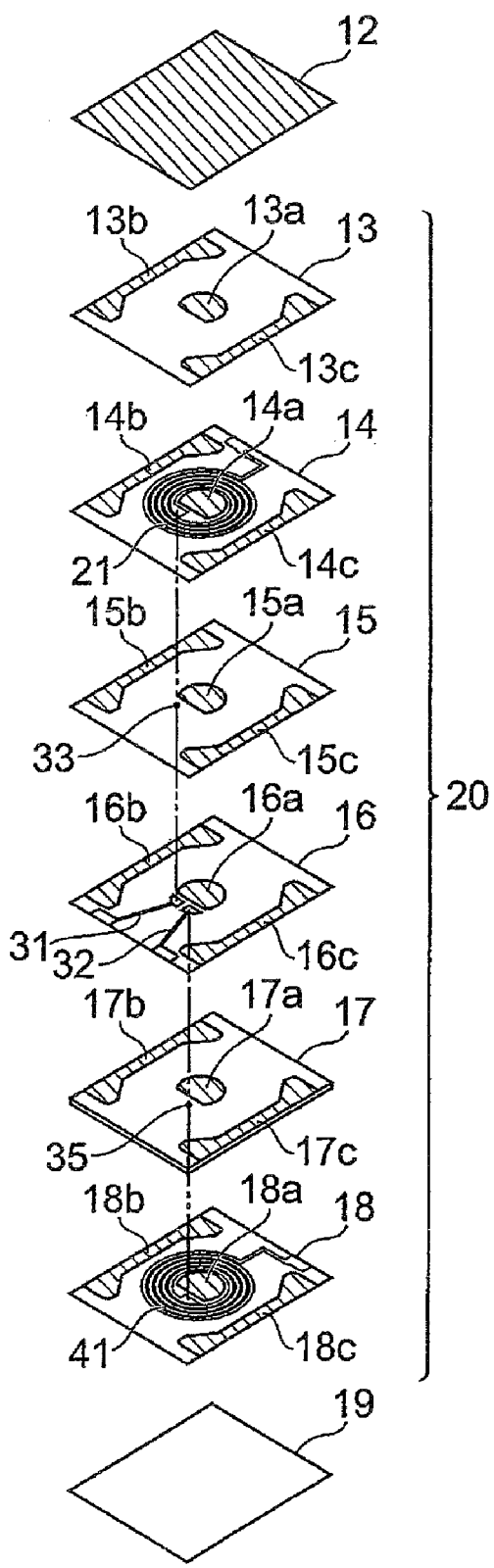
FIG. 2 is an exploded perspective view of a layered structure in the common mode filter according to the embodiment

As shown in FIG. 2, the layered structure 11 has a plurality of layers stacked. In order from a layer located nearest to the upper magnetic substrate 7, the layered structure 11 has a magnetic layer 12, an insulator layer 13, a first coil layer 14, an insulator layer 15, a lead layer 16, an insulator layer 17, a second coil layer 18, and an insulator layer 19. Each of these layers is formed in a rectangular shape. In FIG. 2, the hatched portions indicate portions made of a magnetic material.

The magnetic layer 12 is a layer of a rectangular shape made of a magnetic material such as sintered ferrite or composite ferrite. The insulator layers 13, 15, 17, the first coil layer 14, the lead layer 16, and the second coil layer 18 are formed based on an insulating material such as polyimide resin or epoxy resin, and magnetic regions 13a-18a located in the center of the respective layers and magnetic regions 13b-18b, 13c-18c located on the sides forming the side surfaces 3c, 3d of the laminate 3 are made of a magnetic material.

The magnetic regions 13a-18a are arranged at the same position in the respective layers, and they are regions of a nearly circular shape vacant of an arch portion on the end surface 3e side of the laminate 3. The magnetic regions 13b-18b are arranged at the same position in the respective layers and they are regions extending along the side surface 3c side of the laminate 3, both ends of which at corners of each layer are projecting inwardly. The magnetic regions 13c-18c are arranged at the same position in the respective layers and they are regions extending along the side surface 3d side of the laminate 3, both ends of which at corners of each layer are projecting inwardly.

Namely, in intermediate layers 20 except for the magnetic layer 12 and the insulator layer 19 at the top and bottom in the layered structure 11, regions corresponding to the magnetic regions 13a-18a, regions corresponding to the magnetic regions 13b-18b, and regions corresponding to the magnetic regions 13c-18c through the intermediate layers 20 in the laminated direction.

A magnetic core surrounding first and second planar coils 21, 41 formed in the layered structure 11 is constructed of the magnetic regions 13a-18a, 13b-18b, 13c-18c through the intermediate layers 20, the magnetic layer 12, the upper magnetic substrate 7, and the lower magnetic substrate 9.

Figure 3:
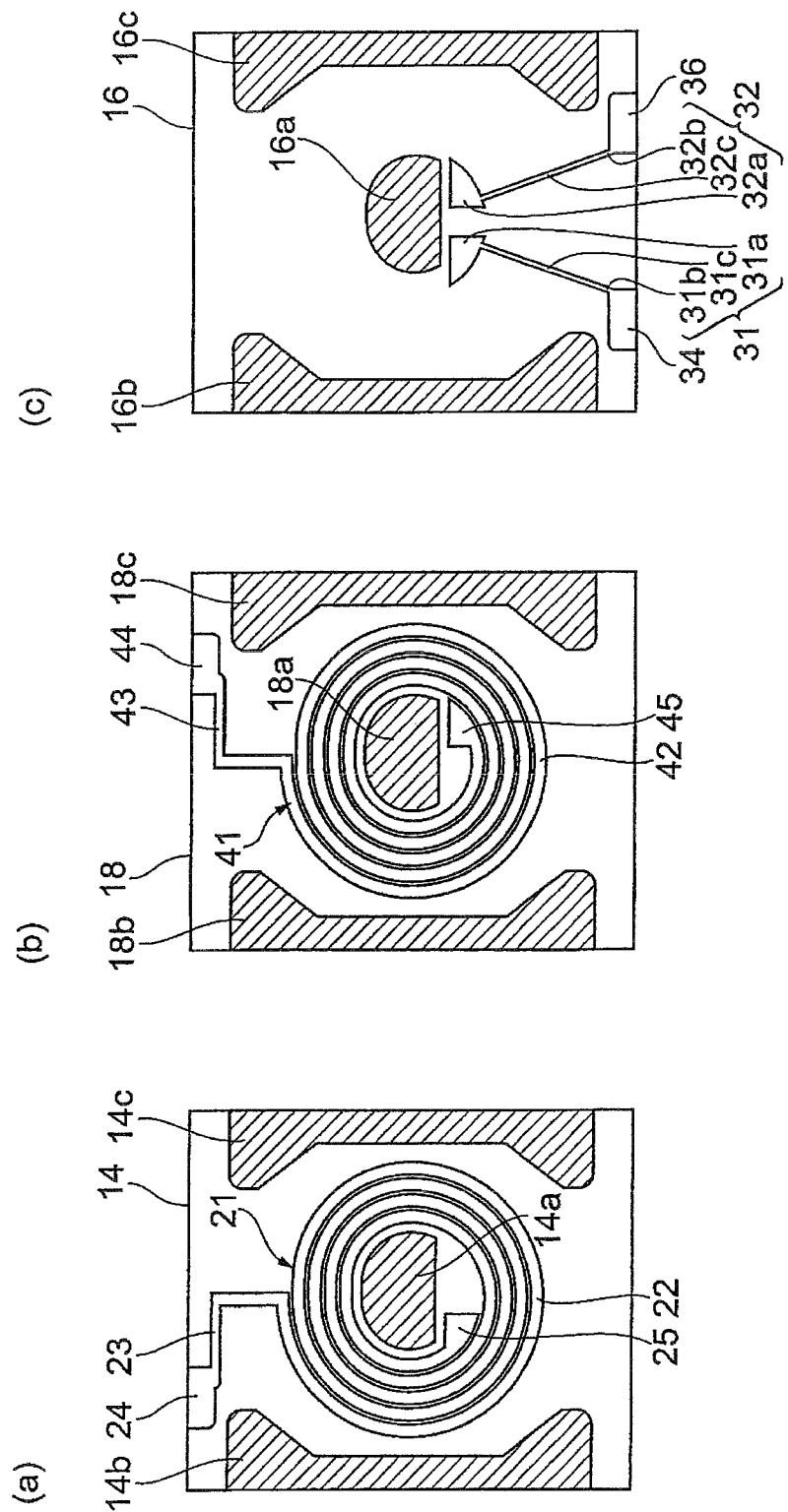
FIG. 3 is plan views showing a first coil layer, a second coil layer, and a lead layer in the common mode filter according to the embodiment.

The below will describe the first and second planar coils 21, 41 surrounded by the magnetic core, and first and second lead wires 31, 32 electrically connected to the first and second planar coils 21, 41, respectively, with reference to FIG. 3

As shown in FIG. 3(a), the first planar coil 21 is provided in the first coil layer 14. The first planar coil 21 is formed in a nearly circular spiral shape in the first coil layer 14. A spiral 22 of the first planar coil 21 is formed in such a spiral shape as to surround the magnetic region 14a formed in the nearly circular shape.

In the first planar coil 21, one end 23 located outside of the spiral 22 is drawn to a short side of the first coil layer 14 so as to form an L-shape and is electrically and mechanically connected to a conductor region 24 formed on the short side. The conductor region 24 is formed nearer to the side surface 3c on the end surface 3f side of the laminate 3 in the first coil layer 14. This conductor region 24 is exposed in the end surface 3f of the laminate 3 and is electrically and mechanically connected to the first terminal electrode 5A formed on this end surface 3f. Namely, the one end 23 of the first planar coil 21 is electrically connected through the conductor region 24 to the first terminal electrode 5A.

In the first planar coil 21, the other end 25 located inside of the spiral 22 is located on the side surface 3c side in the arch-cut zone of the magnetic region 14a. The other end 25 of the first planar coil 21 is made wide in a nearly sectoral shape so as to achieve secure conduction to the first lead wire 31 provided in the lead layer 16.

As shown in FIG. 3(b), the second planar coil 41 is provided in the second coil layer 18. The second planar coil 41 is formed in a nearly circular spiral shape in the second coil layer 18. A spiral 42 of the second planar coil 41 is formed in such a spiral shape as to surround the magnetic region 18a formed in the nearly circular shape.

In the second planar coil 41, one end 43 located outside of the spiral 42 is drawn to a short side of the second coil layer 18 so as to form an L-shape and is electrically and mechanically connected to a conductor region 44 formed on the short side. The conductor region 44 is formed nearer to the side surface 3d on the end surface 3f side of the laminate 3 in the second coil layer 18. This conductor region 44 is exposed in the end surface 3f of the laminate 3 and is electrically and mechanically connected to the second terminal electrode 5B formed on this end surface 3f. Namely, the one end 43 of the second planar coil 41 is electrically connected through the conductor region 44 to the second terminal electrode 5B.

In the second planar coil 41, the other end 45 located inside of the spiral 42 is located on the side surface 3d side in the arch-cut zone of the magnetic region 18a. The other end 45 of the second planar coil 41 is made wide in a nearly sectoral shape so as to achieve secure conduction to the second lead wire 32 provided in the lead layer 16.

As shown in FIG. 3(c), the first lead wire 31 and the second lead wire 32 are provided as separated from each other in the lead layer 16. One end 31a of the first lead wire 31 is located on the side surface 3c side in the arch-cut zone of the magnetic region 16a. Namely, the one end 31a of the first lead wire 31 is superimposed on the other end 25 of the first planar coil 21 when viewed from the laminated direction. The one end 31a of the first lead wire 31 is made wide in a nearly sectoral shape so as to achieve secure electrical connection with the other end 25 of the first planar coil 21 through a contact conductor 33 formed in the insulator layer 15.

The other end 31b of the first lead wire 31 is electrically and mechanically connected to a conductor region 34 formed nearer to the side surface 3c on the end surface 3e side of the laminate 3, in the lead layer 16. The conductor region 34 is exposed in the end surface 3e of the laminate 3 and is electrically and mechanically connected to the third terminal electrode 5C formed on this end surface 3e. Namely, the other end 31b of the first lead wire 31 is electrically connected through the conductor region 34 to the third terminal electrode 5C.

This achieves electrical connection among the first terminal electrode 5A, conductor region 24, first planar coil 21, first lead wire 31, conductor region 34, and third terminal electrode 5C. The conductor region 24, first planar coil 21, first lead wire 31, and conductor region 34 are made of a metal material such as Cu or Al having excellent electrical conductivity and processability.

One end 32a of the second lead wire 32 is located on the side surface 3d side in the arch-cut zone of the magnetic region 16a. Namely, the one end 32a of the second lead wire 32 is superimposed on the other end 45 of the second planar coil 41 when viewed from the laminated direction. This one end 32a is made wide in a nearly sectoral shape so as to achieve secure electrical connection with the other end 45 of the second planar coil 41 through a contact conductor 35 formed in the insulator layer 17.

The other end 32b of the second lead wire 32 is electrically and mechanically connected to a conductor region 36 formed nearer to the side surface 3d on the end surface 3e side of the laminate 3, in the lead layer 16. The conductor region 36 is exposed in the end surface 3e of the laminate 3 and is electrically and mechanically connected to the fourth terminal electrode 5D formed on this end surface 3e. Namely, the other end 32b of the second lead wire 32 is electrically connected through the conductor region 36 to the fourth terminal electrode 5D.

This achieves electrical connection among the second terminal electrode 5B, conductor region 44, second planar coil 41, second lead wire 32, conductor region 36, and fourth terminal electrode 5D. The conductor region 44, second planar coil 41, second lead wire 32, and conductor region 36 are made of a metal material such as Cu or Al having excellent electrical conductivity and processability.

The first lead wire 31 has a first straight portion 31c linearly connecting the one end 31a and the other end 31b. The second lead wire 32 has a second straight portion 32c linearly connecting the one end 32a and the other end 32b. The first straight portion 31c and the second straight portion 32c are arranged so as to be not parallel to each other in the lead layer 16 in "✓✓" shape or inverted V shape without top (shape in which the distance between the straight portions increases toward the other ends 31b, 32b).

Figure 4:
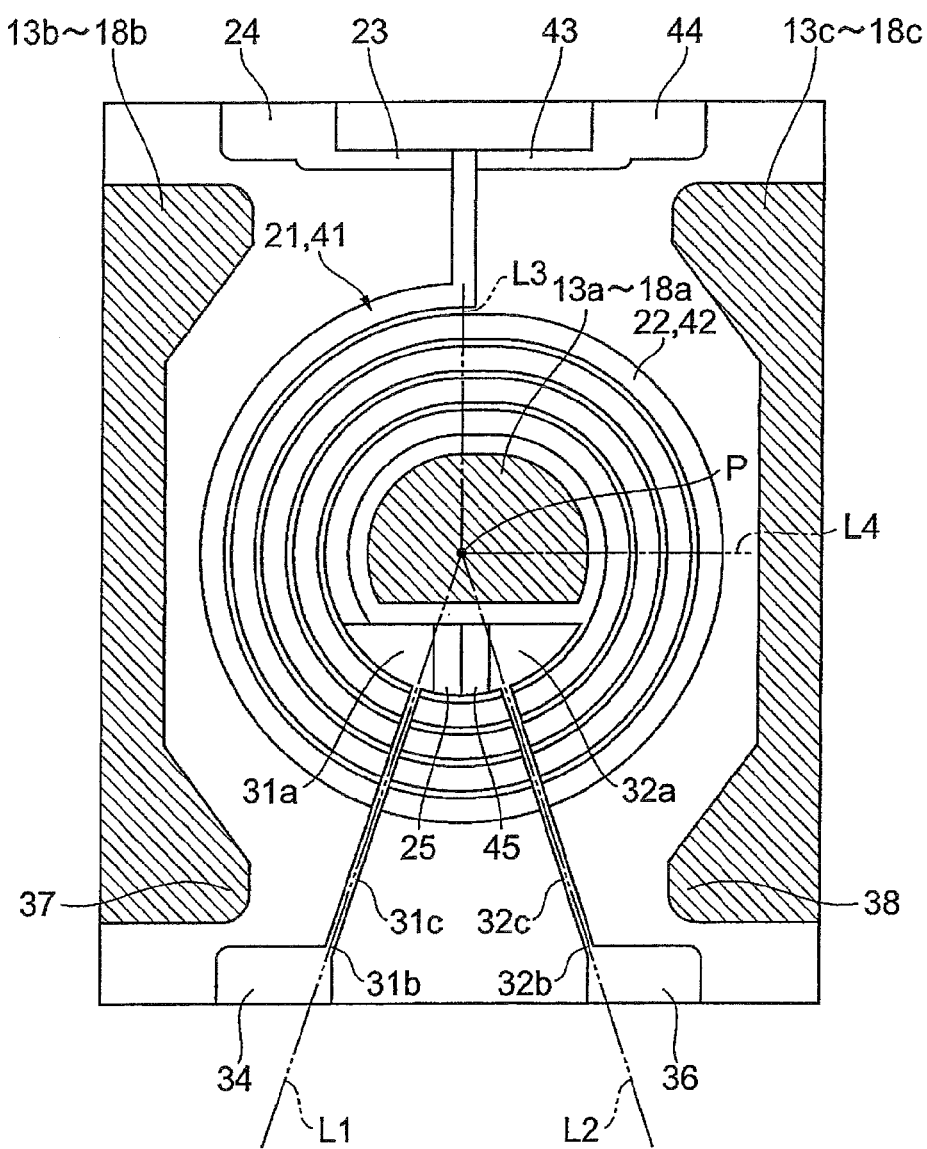
FIG. 4 is a drawing showing an arrangement relation in a laminated direction among a first planar coil, a second planar coil, a first lead wire, and a second lead wire in the common mode filter according to the embodiment

FIG. 4 is a drawing showing the positional relationship among the first and second planar coils 21, 41 and the first and second lead wires 31, 32 as viewed from the laminated direction. In addition thereto, FIG. 4 also shows the magnetic regions 13a-18a, 13b-18b, 13c-18c. As shown in FIG. 4, when viewed from the laminated direction, the first and second lead wires 31, 32, the magnetic regions 13a-18a, 13b-18b, 13c-18c, and the conductor regions 24, 34, 36, 44 are arranged in symmetry with respect to a plane passing the center of the laminate 3 and being parallel to the side surface 3c.

The spiral 22 of the first planar coil 21 and the spiral 42 of the second planar coil 41 are opposed to each other and, when viewed from the laminated direction, curves of conductors forming the spirals are superimposed on each other. This configuration enhances magnetic coupling between the first planar coil 21 and the second planar coil 41 and enhances the effect of rejecting common mode noise.

The magnetic regions 13a-18a penetrate the centers of the first planar coil 21 and the second planar coil 41 in the laminated direction. The regions composed of the magnetic regions 13b-18b and the magnetic regions 13c-18c are arranged so as to cover the first plan coil 21 and the second planar coil 41 from the side surface 3c side and the side surface 3d side. Particularly, in the magnetic regions 13b-18b and the magnetic regions 13c-18c, portions 37, 38 on the end surface 3e side are projecting into spaces between the first and second planar coils 21, 41 and the first and second lead wires 31, 32. For this reason, magnetic paths are effectively formed around the first and second planar coils 21, 41.

The geometrical shape of the spirals 22, 42 will be described on an XY plane coordinate system on a view from the laminated direction. This XY plane coordinate system has the origin at the approximate center P of the laminate 3 and the X-axis along an axis parallel to the end surfaces 3e, 3f. In the spirals 22, 42, regions located in the second to fourth quadrants of the XY plane coordinate system are formed on four concentric circles centered on the center P. These four circles are formed at an equal pitch. In the spirals 22, 42, the regions located in the second to fourth quadrants of the XY plane coordinate system are a zone in which an interior angle between straight line L3 and straight line L4 is 270°, in FIG. 4.

The first straight portion 31c of the first lead wire 31 and the second straight portion 32c of the second lead wire 32 each are radially drawn from the inside to the outside of the spirals 22, 42 of the first and second planar coils 21, 41, when viewed from the laminated direction. Therefore, each of the first straight portion 31c and the second straight portion 32c intersect with the spirals 22, 42 of the first and second planar coils 21, 41 at a plurality of points (four points in the present embodiment) when viewed from the laminated direction.

The first straight portion 31c is located in the third quadrant of the XY plane coordinate system and the second straight portion 32c in the fourth quadrant of the XY plane coordinate system; therefore, in curves forming the spirals 22, 42, regions located in the second to fourth quadrants, including the regions intersecting with the first straight portion 31c and the regions intersecting with the second straight portion 32c, are formed on concentric circles.

Figure 5:
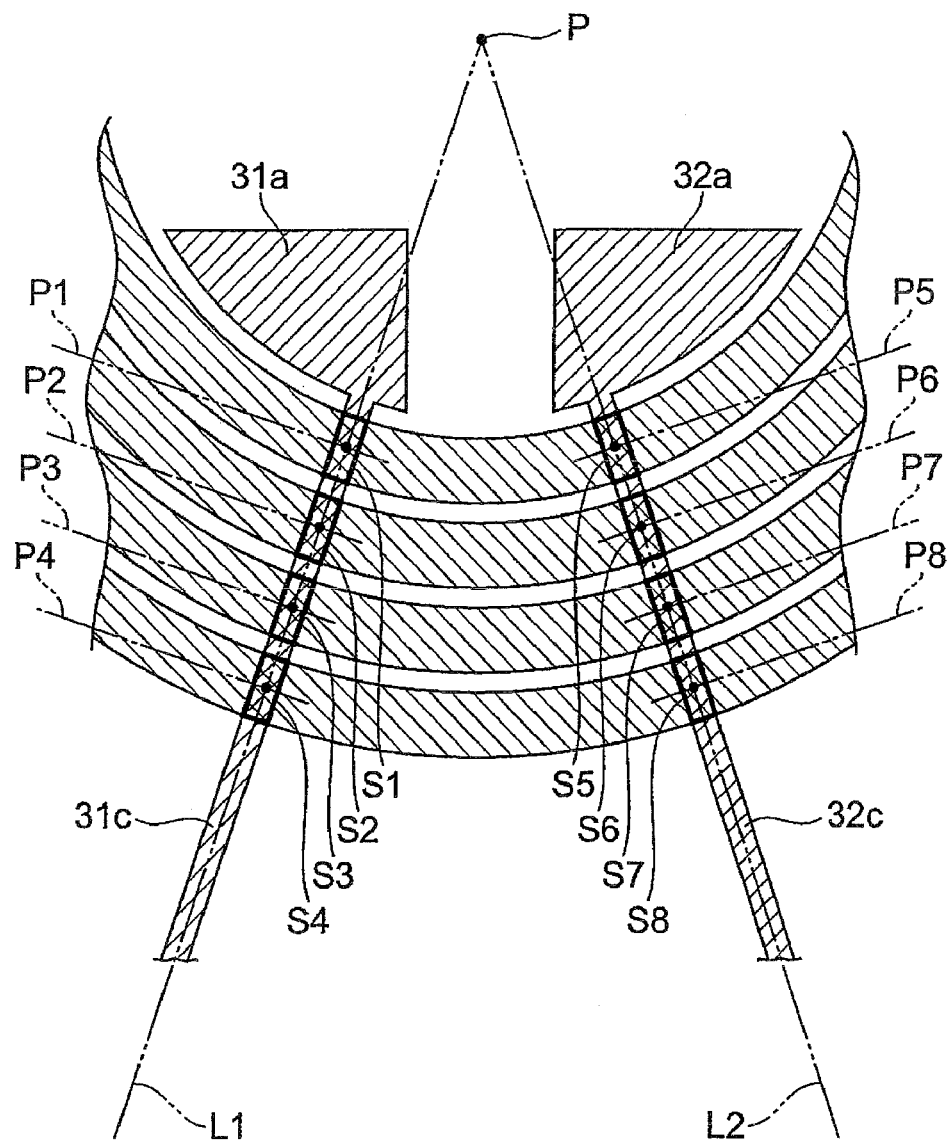
FIG. 5 is a partly enlarged view of FIG. 4.

FIG. 5 is a drawing showing a region where the first straight portion 31c and the second straight portion 32c intersect with the spirals 22, 42. For easier viewing, hatching is provided in the regions of the spirals 22, 42 and the first and second lead wires 31, 32. As shown in FIG. 5, when viewed from the laminated direction, four first tangent lines P1-P4 at four intersection points where the spirals 22, 42 intersect with the first straight portion 31c, are parallel to each other. Then the first straight portion 31c is located on a straight line L1 passing the center P. Namely, the first straight portion 31c is located on a straight line perpendicular to the first tangent lines P1-P4 when viewed from the laminated direction.

This arrangement minimizes each of areas of four overlaps S1-S4 where the first straight portion 31c overlaps with the spirals 22, 42 when viewed from the laminated direction. Namely, the sum of the areas of the overlaps S1-S4 becomes minimum.

Furthermore, four second tangent lines P5-P8 at four intersection points where the spirals 22, 42 intersect with the second straight portion 32c, are parallel to each other when viewed from the laminated direction. Then the second straight portion 32c is located on a straight line passing the center P. Namely, the second straight portion 32c is located on a straight line L2 perpendicular to the second tangent lines P5-P8, when viewed from the laminated direction.

This arrangement minimizes each of areas of four overlaps S5-S8 where the second straight portion 32c overlaps with the spirals 22, 42 when viewed from the laminated direction. Namely, the sum of the areas of the overlaps S5-S8 becomes minimum.

The below will describe a procedure of producing the common mode filter 1 of the present embodiment, with reference to FIG. 2 and others. First, for fabrication of the laminate 3, the lower magnetic substrate 9 is prepared and the layers forming the layered structure 11 are formed in order on the lower magnetic substrate 9. The first step is to apply a resin material onto the lower magnetic substrate 9 by spin coating, dipping, spraying, or the like and to cure it, thereby forming the insulator layer 19. The next step is to form a thin conductor film on the insulator layer 19 and to form the second planar coil 41 and conductor region 44 by photolithography.

Next, a resin material is applied and cured on the insulator layer 19 with the second planar coil 41 and conductor region 44 therein, thereby forming the second coil layer 18 with the second planar coil 41 and conductor region 44, and the insulator layer 17 on the basis of the insulator. Then etching is conducted to form a contact hole for electrical connection between the other end 45 of the second planar coil and the second lead wire 32, in the insulator layer 17. Simultaneously with the formation of the contact hole 35, the resin is removed from the magnetic regions 18a-18c, 17a-17c in the second coil layer 18 and the insulator layer 17.

The next step is to form the first and second lead wires 31, 32 and the conductor regions 34, 36 on the insulator layer 17. Then the lead layer 16 with the first and second lead wires 31, 32 and conductor regions 34, 36, and the insulator layer 15 are formed based on an insulator according to a procedure similar to the above-described procedure. Thereafter, a contact hole 33 for electrical connection between the other end 25 of the first planar coil 21 and the first lead wire 31 is formed in the insulator layer 15 and the resin is removed from the magnetic regions 16a-16c, 15a-15c in the lead layer 16 and the insulator layer 15.

The next step is to form the first planar coil 21 and the conductor region 24 on the insulator layer 15. Then the first coil layer 14 with the first planar coil 21 and the conductor region 24, and the insulator layer 13 are formed based on an insulator according to a procedure similar to the above-described procedure. Then the resin is removed from the magnetic regions 14a-14c, 13a-13c in the first coil layer 14 and the insulator layer 13.

The above process results in forming a layered structure intermediate incorporating the first and second planar coils 21, 42, the first and second lead wires 31, 32, and the conductor regions 24, 34, 36, 44, on the lower magnetic substrate 9. In this layered structure intermediate, the magnetic regions 13a-18a, 13b-18b, 13c-18c penetrate from the insulator layer 13 to the second coil layer 18 except for the lowermost insulator layer 19.

A magnetic-powder-containing resin is filled in the magnetic regions 13a-18a, 13b-18b, 13c-18c in this layered structure intermediate and applied onto the upper surface of the layered structure intermediate, followed by curing. This step results in filling the magnetic regions 13a-18a, 13b-18b, 13c-18c of the layered structure intermediate with the magnetic body to form the intermediate layers 20, and forming the magnetic layer 12 on the intermediate layers 20. Then the upper surface of the magnetic layer 12 is polished to be flattened. Thereafter, an adhesive such as epoxy resin is applied onto the magnetic layer 12 and the upper magnetic substrate 7 is bonded thereto. This results in obtaining the aforementioned laminate 3.

Thereafter, the first and second terminal electrodes 5A, 5B are formed on the end surface 3f of the laminate 3 and the third and fourth terminal electrodes 5C, 5D on the end surface 3e. Specifically, for example, Cr/Cu films or Ti/Cu films are deposited on the end surfaces 3e, 3f of the laminate 3 by a mask sputtering method and then electroplating with Ni/Sn films are conducted to form the first to fourth terminal electrodes 5A-5D. The above completes the common mode filter 1.

The common mode filter 1 described above has the three-layered structure in which the first coil layer 14, second coil layer 18, and lead layer 16 are stacked through the insulator layers 15, 17. This structure can achieve reduction in cost and reduction in size and profile as compared with the four-layered structure. The first planar coil 21 and the second planar coil 41 are formed in the nearly circular spiral shape. For this reason, the coil length becomes shorter than in the case where the planar coils are formed in the rectangular spiral shape, whereby the high-frequency characteristics are improved.

The spirals 22, 42 of the first planar coil 21 and the second planar coil 41 are formed so that the plurality of first tangent lines P1-P4 thereto at the plurality of respective intersection points cross with the first straight portion 31c of the first lead wire 31 are parallel to each other, when viewed from the laminated direction, and the first straight portion 31c is located on the straight line L1 perpendicular to the plurality of first tangent lines P1-P4, when viewed from the laminated direction. This arrangement can minimize the sum of the areas of the overlaps S1-S4 in the laminated direction between the first straight portion 31c and the spirals 22, 42. Therefore, the electrical capacitance produced between the spirals 22, 42 and the first straight portion 31c becomes smaller, so as to improve the high-frequency characteristics.

Furthermore, the spirals 22, 42 of the first planar coil 21 and the second planar coil 41 are formed so that the plurality of second tangent lines P5-P8 thereto at the plurality of respective intersection points cross with the second straight portion 32c of the second lead wire 32 are parallel to each other, when viewed from the laminated direction, and the second straight portion 32c is located on the straight line L2 perpendicular to the plurality of second tangent lines P5-P8, when viewed from the laminated direction. This arrangement can minimize the sum of the areas of the overlaps S5-S8 in the laminated direction between the second straight portion 32c and the spirals 22, 42. Therefore, the electrical capacitance produced between the spirals 22, 42 and the second straight portion 32c can be made smaller, so as to improve the high-frequency characteristics.

In the common mode filter 1, the spiral 22 of the first planar coil 21 and the spiral 42 of the second planar coil 41 are superimposed on each other in the laminated direction. This configuration makes easy to arrange the first straight portion 31c and the second straight portion 32c so as to be located on the respective straight lines L1, L2 perpendicular to the plurality of first and second tangent lines P1-P8 to the two spirals 22, 42.

In the common mode filter 1, the regions including the regions intersecting with the first straight portion 31c and the regions intersecting with the second straight portion 32c in the curves constituting the spirals 22, 42 of the first planar coil 21 and the second planar coil 41 are formed on concentric circles. For this reason, it is easy to arrange the first straight portion 31c and the second straight portion 32c so as to be located on the respective straight lines L1, L2 perpendicular to the plurality of first and second tangent lines P1-P8 to the two spirals 22, 42.

In the common mode filter 1, the lead layer 16 is arranged between the first coil layer 14 and the second coil layer 18.

Incidentally, the common mode filter of the conventional technology has the configuration wherein the first straight portion and the second straight portion drawn from the inside to the outside of the spirals of the coils in the first lead wire and the second lead wire extend perpendicularly to the end surface of the laminate to which the first and second lead wires are drawn out, and they are arranged in parallel with each other. In the case where the first lead wire and the second lead wire are arranged in an identical layer, the first lead wire and the second lead wire need to be arranged as separated from each other. For this reason, the first straight portion and the second straight portion are not arranged perpendicularly to any tangent line out of the plurality of tangent lines at intersections with the spirals of the coils.

Let us compare the common mode filter 1 of the present embodiment with the common mode filter in which the first straight portion and the second straight portion are arranged in parallel with each other. This common mode filter of the comparative example is formed in the same structure as the common mode filter 1 of the present embodiment, except that the first straight portion and the second straight portion are arranged in parallel with each other.

In the common mode filter of the comparative example, where the line width of the first and second straight portions is 16 μm, the total area of the overlaps between the first and second straight portions and the spirals is 9880 μm$^2$; whereas the total area of the overlaps S1-S8 in the common mode filter 1 of the present embodiment is smaller, 9730 μm$^2$. For this reason, the cutoff frequency is 6.69 GHz in the common mode filter of the comparative example, whereas the cutoff frequency of the common mode filter 1 of the present embodiment is extended to the higher frequency side, 6.72 GHz. The cutoff frequency in the present embodiment is a cutoff frequency at −3 dB relative to a flat portion in the low frequency region.

In the common mode filter of the comparative example, where the line width of the first and second straight portions is 10 μm, the total area of the overlaps between the first and second straight portions and the spirals is 6160 μm$^2$; whereas the total area of the overlaps S1-S8 in the common mode filter 1 of the present embodiment is smaller, 6080 μm$^2$. For this reason, the cutoff frequency is 6.78 GHz in the common mode filter of the comparative example, whereas the cutoff frequency of the common mode filter 1 of the present embodiment is extended to the higher frequency side, 6.80 GHz.

In the common mode filter of the comparative example, where the line width of the first and second straight portions is 5 μm, the total area of the overlaps between the first and second straight portions and the spirals is 3080 μm$^2$; whereas the total area of the overlaps S1-S8 in the common mode filter 1 of the present embodiment is smaller, 3040 μm$^2$. For this reason, the cutoff frequency is 6.85 GHz in the common mode filter of the comparative example, whereas the cutoff frequency of the common mode filter 1 of the present embodiment is extended to the higher frequency side, 6.86 GHz.

The common mode filter of the comparative example is configured so that the shape of the spirals is the same as the shape of the spirals 22, 42 in the common mode filter 1 of the present embodiment, but in a spiral centered on a point, a straight line passing the point does not intersect perpendicularly with a plurality of tangent lines at intersections with the spiral. For this reason, the total area of the overlaps between the first and second straight portions and the spirals in the conventional common mode filter becomes larger than that in the common mode filter of the comparative example, and the cutoff frequency resides on the lower frequency side.

In contrast to it, the present embodiment adopts the configuration wherein the spirals 22, 42 are formed so that the plurality of first tangent lines P1-P4 thereto at the plurality of respective intersection points cross with the first straight portion 31c of the first lead wire 31 are parallel to each other, when viewed from the laminated direction. Therefore, the first straight portion 31c can be arranged on the straight line L1 perpendicular to the plurality of first tangent lines P1-P4. Similarly, the spirals 22, 42 are formed so that the plurality of second tangent lines P5-P8 thereto at the plurality of respective intersection points cross with the second straight portion 32c of the second lead wire 32 are parallel to each other, when viewed from the laminated direction. Therefore, the second straight portion 32c can be arranged on the straight line L2 perpendicular to the plurality of second tangent lines P5-P8. Accordingly, it is feasible to minimize the sum of the areas of the overlaps S1-S4 between the first straight portion 31c and the spirals 22, 42 and the areas of the overlaps S5-S8 between the second straight portion 32c and the spirals 22, 42.

The present invention is by no means limited to the above embodiment and can be modified in many ways.

For example, the above embodiment showed the example wherein the angle between the first straight portion 31c and the second straight portion 32c was approximately 17°, but the present invention is not limited to this. The significant point is that the first straight portion 31c is located on the straight line L1 perpendicular to the plurality of first tangent lines P1-P4 to the spiral 22 and that the second straight portion 32c is located on the straight line L2 perpendicular to the plurality of second tangent lines P5-P8 to the spiral 42. However, for arranging the first straight portion and the second straight portion on the respective straight lines L1, L2 and arranging the first straight portion and the second straight portion as separated from each other, the angle between the first straight portion and the second straight portion is preferably not less than 15°.

Furthermore, it is necessary to certainly secure the magnetic regions 16b, 16c, in order to cover the spirals 22, 42 of the first and second planar coils 21, 41 from the two side surfaces 3c, 3d of the laminate 3 by the magnetic regions 13b-18b, 13c-18c. For this reason, the angle between the first straight portion and the second straight portion is preferably not more than 45°.

Figure 6:
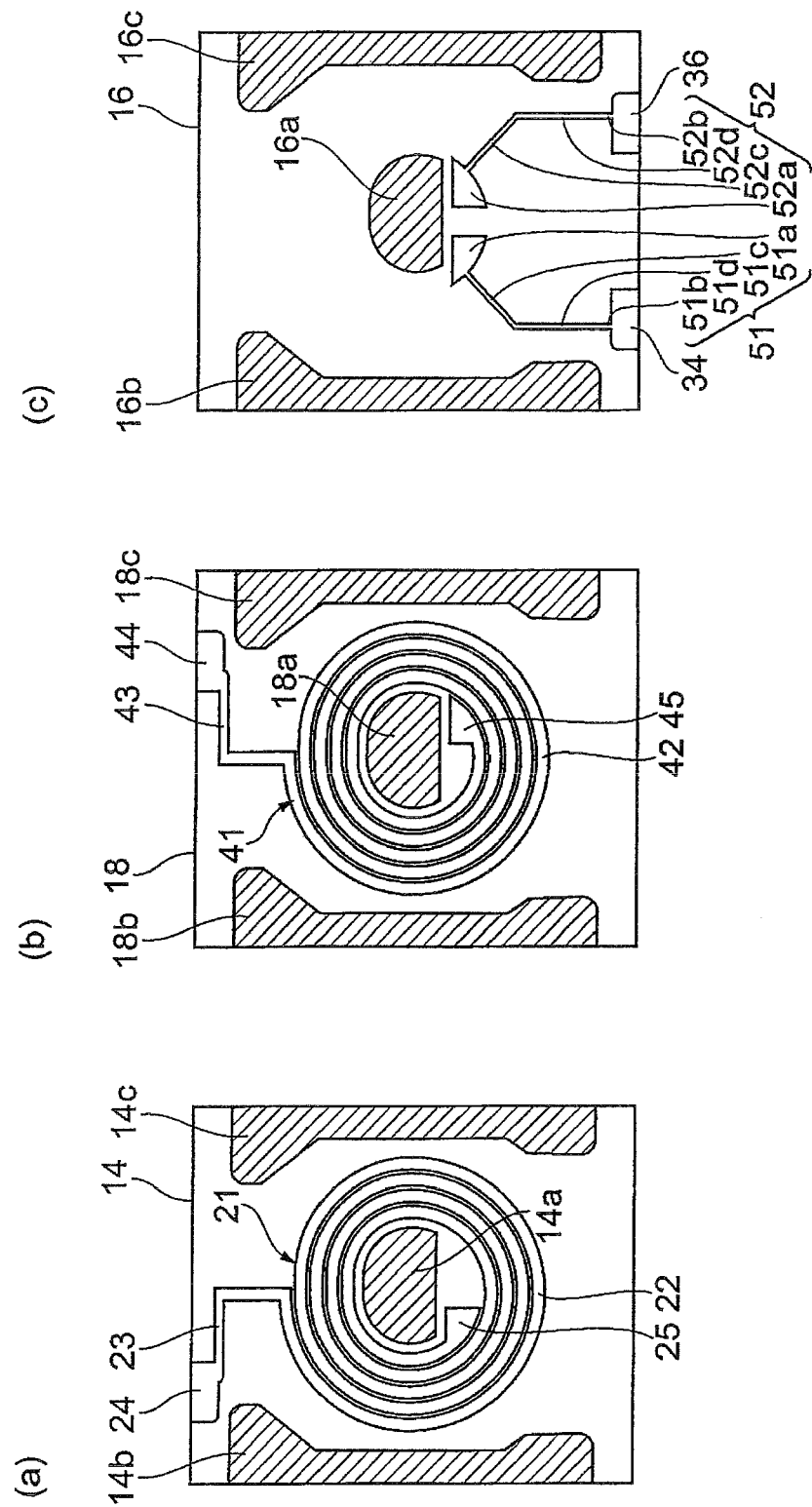
FIG. 6 is plan views showing a case where an angle between a first straight portion and a second straight portion in the common mode filter of the embodiment is 45°.

FIG. 6(c) shows a case where the angle between the first straight portion and the second straight portion is about 45°. The common mode filter of this modification example has first and second lead wires 51, 52, instead of the first and second lead wires 31, 32.

One ends 51a, 52a of the first and second lead wires 51, 52 are formed in the same shape and arranged at the same positions as the one ends 31a, 32a of the first and second lead wires 31, 32. The other ends 51b, 52b of the first and second lead wires 51, 52 are electrically and mechanically connected to respective conductor regions 34, 36.

The first lead wire 51 has a first straight portion 51c and a connection portion 51d connecting the one end 51a and the other end 51b. This first straight portion 51c is drawn from the inside to the outside of the spirals 22, 42, when viewed from the laminated direction, and located on the straight line L1 passing the center P of the spirals 22, 42. Namely, the first straight portion 51c is located on the straight line L1 perpendicular to the tangent lines P1-P4 to the spiral 22. The connection portion 51d is also formed in a linear shape to connect the first straight portion 51c and the conductor region 34.

The second lead wire 52 has a second straight portion 52c and a connection portion 52d connecting the one end 52a and the other end 52b. This second straight portion 52c is drawn from the inside to the outside of the spirals 22, 42, when viewed from the laminated direction, and located on the straight line L2 passing the center P of the spirals 22, 42. Namely, the second straight portion 52c is located on the straight line L2 perpendicular to the tangent lines P5-P8 to the spiral 42. The connection portion 52d is also formed in a linear shape to connect the second straight portion 52c and the conductor region 36.

The angle between the first straight portion 51c and the second straight portion 52c is about 45°. For certainly securing the magnetic regions 16b, 16c, the connection portion 51d and the connection portion 52d are arranged in parallel with the side surfaces 3c, 3d of the laminate 3. Therefore, it becomes feasible to efficiently arrange the magnetic body and to minimize the sum of the areas of the overlaps S1-S4 between the first straight portion 51c and the spirals 22, 42 of the first and second planar coils 21, 41 and the sum of the areas of the overlaps S5-S8 between the second straight portion 52c and the spirals 22, 42 of the first and second planar coils 21, 41.

As shown in FIGS. 6(a)-(c), the shapes of the magnetic regions 13b-18b, 13c-18c may be modified according to the arrangement of the first and second lead wires.

Figure 7:
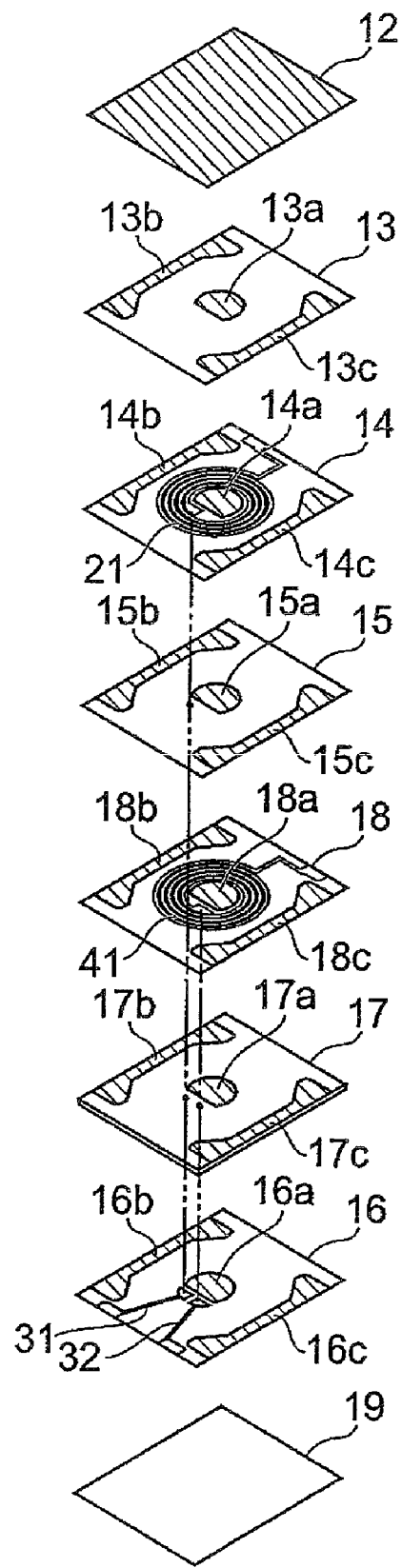
FIG. 7 is an exploded perspective view showing a modification example of the layered structure in the common mode filter according to the embodiment.

The above embodiment showed the example wherein the lead layer 16 was located between the first coil layer 14 and the second coil layer 18, but the present invention is not limited to this. As shown in FIG. 7, it is also possible to adopt a configuration wherein the first coil layer 14 and the second coil layer 18 are located next to each other through the insulator layer 15 and wherein the second coil layer 18 and the lead layer 16 are located next to each other through the insulator layer 17.

The above embodiment showed the example wherein the spiral 22 of the first planar coil 21 and the spiral 42 of the second planar coil 41 were superimposed on each other in the laminated direction, but they may be displaced from each other when viewed in the laminated direction. In this case, each of the first straight portion 31c and the second straight portion 32c is preferably located on a straight line perpendicular to a plurality of tangent lines to one spiral closer thereto out of the two spirals 22, 42. In this case, the electrical capacitance produced between the first and second straight portions and the spirals can be more efficiently reduced, so as to improve the high-frequency characteristics.

For example, the above embodiment showed the example wherein the regions of the spirals 22, 42 in the second to fourth quadrants were located on concentric circles, but the present invention is not limited to this. It is sufficient that at least one of the spirals 22, 42 be formed so that a plurality of tangent lines thereto at a plurality of respective intersection points cross with the first straight portion or the second straight portion are parallel to each other.

What is claimed is:

1. A common mode filter comprising a laminate, and first, second, third, and fourth terminal electrodes formed on an outer surface of the laminate,
    wherein the laminate has a layered structure comprising three layers including a first coil layer, a second coil layer, and a lead layer, and insulator layers located between the three layers,
    wherein in the first coil layer there is a first planar coil which is formed in a substantially circular spiral shape and one end of which located outside of the spiral is electrically connected to the first terminal electrode,
    wherein in the second coil layer there is a second planar coil which is formed in a substantially circular spiral shape and one end of which located outside of the spiral is electrically connected to the second terminal electrode,
    wherein in the lead layer there are:
    a first lead wire one end of which is electrically connected to other end located inside of the spiral of the first planar coil and other end of which is electrically connected to the third terminal electrode; and
    a second lead wire one end of which is electrically connected to other end located inside of the spiral of the second planar coil and other end of which is electrically connected to the fourth terminal electrode,
    wherein the first lead wire has a first straight portion drawn from the inside to the outside of the spiral of the first planar coil, when viewed from a laminated direction of the laminate,
    wherein the second lead wire has a second straight portion drawn from the inside to the outside of the spiral of the second planar coil, when viewed from the laminated direction of the laminate,
    wherein the spiral of at least one of the first planar coil and the second planar coil is formed so that a plurality of first tangent lines thereto at a plurality of respective intersection points cross with the first straight portion are parallel to each other, when viewed from the laminated direction, and
    wherein the first straight portion is located on a straight line perpendicular to the plurality of first tangent lines, when viewed from the laminated direction.

2. The common mode filter according to claim 1,
    wherein the spiral of at least one of the first planar coil and the second planar coil is formed so that a plurality of second tangent lines thereto at a plurality of respective intersection points cross with the second straight portion are parallel to each other, when viewed from the laminated direction, and
    wherein the second straight portion is located on a straight line perpendicular to the plurality of second tangent lines, when viewed from the laminated direction.

3. The common mode filter according to claim 2,
    wherein the second coil layer and the lead layer are located next to each other through the insulator layer, and
    wherein the spiral of the second planar coil is formed so that the plurality of first tangent lines thereto at the plurality of respective intersection points cross with the first straight portion are parallel to each other, when viewed from the laminated direction, and so that the plurality of second tangent lines thereto at the plurality of respective intersection points cross with the second straight portion are parallel to each other, when viewed from the laminated direction.

4. The common mode filter according to claim 2,
    wherein the first coil layer and the lead layer are located next to each other through the insulator layer, and
    wherein the spiral of the first planar coil is formed so that the plurality of first tangent lines thereto at the plurality of respective intersection points cross with the first straight portion are parallel to each other, when viewed from the laminated direction, and so that the plurality of second tangent lines thereto at the plurality of respective intersection points cross with the second straight portion are parallel to each other, when viewed from the laminated direction.

5. The common mode filter according to claim 1, wherein an angle between the first straight portion and the second straight portion is between 15° and 45° both inclusive.

6. The common mode filter according to claim 1, wherein the spiral of the first planar coil and the spiral of the second planar coil are superimposed on each other in the laminated direction.

7. The common mode filter according to claim 6, wherein in curves forming the spirals of the first planar coil and the second planar coil, regions including regions intersecting with the first straight portion and regions intersecting with the second straight portion are formed on concentric circles.

8. The common mode filter according to claim 1, wherein the laminate has a pair of magnetic substrates, and the layered structure interposed between the pair of magnetic substrates.

* * * * *